United States Patent
Herberholz et al.

(10) Patent No.: US 10,964,379 B2
(45) Date of Patent: Mar. 30, 2021

(54) RING OSCILLATOR BASED BITCELL DELAY MONITOR

(71) Applicant: Arm Limited, Cambridge (GB)

(72) Inventors: Rainer Herberholz, Great Abington (GB); George McNeil Lattimore, Austin, TX (US); Amit Chhabra, Noida (IN)

(73) Assignee: Arm Limited, Cambridge (GB)

(*) Notice: Subject to any disclaimer, the term of this patent is extended or adjusted under 35 U.S.C. 154(b) by 0 days.

(21) Appl. No.: 16/183,655

(22) Filed: Nov. 7, 2018

(65) Prior Publication Data

US 2020/0143873 A1    May 7, 2020

(51) Int. Cl.
    *H03K 3/03*     (2006.01)
    *G11C 11/412*   (2006.01)
    *G11C 11/417*   (2006.01)
    *H03K 5/00*     (2006.01)

(52) U.S. Cl.
    CPC .......... *G11C 11/412* (2013.01); *G11C 11/417* (2013.01); *H03K 3/0315* (2013.01); *H03K 5/00* (2013.01); *H03K 2005/00078* (2013.01)

(58) Field of Classification Search
    CPC ..... G11C 11/412; G11C 11/417; G11C 7/222; H03K 3/0315; H03K 3/0322
    USPC .......................................................... 331/57
    See application file for complete search history.

(56) References Cited

U.S. PATENT DOCUMENTS

| | | | | |
|---|---|---|---|---|
| 7,082,067 B2* | 7/2006 | Venkatraman | ......... | G11C 29/50 331/57 |
| 7,142,064 B2* | 11/2006 | Chan | ................ | G01R 31/31725 331/57 |
| 7,376,001 B2* | 5/2008 | Joshi | ....................... | G11C 29/50 365/154 |
| 7,518,394 B1* | 4/2009 | Chirania | ............ | H03K 19/1776 324/762.01 |
| 7,609,542 B2* | 10/2009 | Adams | .................. | G11C 11/413 365/154 |
| 7,684,263 B2* | 3/2010 | Adams | .................. | G11C 11/413 365/154 |
| 8,004,878 B2* | 8/2011 | Asayama | ................. | G11C 8/08 365/154 |
| 8,330,478 B2 | 12/2012 | Myers et al. | | |
| 9,123,446 B1* | 9/2015 | Ecker | ............... | G11C 29/50012 |
| 9,343,182 B2* | 5/2016 | Jungmann | ........ | G11C 29/50012 |
| 2004/0061561 A1* | 4/2004 | Monzel | .................. | G11C 29/50 331/57 |
| 2007/0086232 A1 | 4/2007 | Joshi et al. | | |
| 2013/0222071 A1* | 8/2013 | Chuang | .................... | G11C 7/04 331/57 |

(Continued)

OTHER PUBLICATIONS

Arm Limited; PCT / GB2018 / 052771; filed Sep. 28, 2018.

(Continued)

*Primary Examiner* — Levi Gannon
(74) *Attorney, Agent, or Firm* — Pramudji Law Group PLLC; Ari Pramudji

(57) ABSTRACT

Various implementations described herein refer to an integrated circuit having a row of bitcells that are chained together in series to operate as a ring oscillator. Each bitcell in the row of bitcells has multiple transistors that are independent of additional transistors to form the ring oscillator. The multiple transistors of each bitcell in the row of bitcells are arranged to function as an inverter.

26 Claims, 15 Drawing Sheets

(56) References Cited

U.S. PATENT DOCUMENTS

| | | | |
|---|---|---|---|
| 2014/0210561 A1* | 7/2014 | Moriwaki | H03K 3/0315 |
| | | | 331/57 |
| 2015/0015274 A1 | 1/2015 | Jungmann et al. | |
| 2016/0202953 A1* | 7/2016 | Chen | G11C 11/417 |
| | | | 708/250 |
| 2017/0365332 A1 | 12/2017 | Ecker | |
| 2018/0233193 A1 | 8/2018 | Kumar et al. | |

OTHER PUBLICATIONS

Sandhu, et al.; U.S. Appl. No. 15/691,722, filed Aug. 30, 2017.
Tsai, et al.; SRAM Stability Characterization Using Tunable Ring Oscillators in 45nm CMOS; ISSCC 2010; Feb. 10, 2010.
Hot Chips 2003—Intelligent Energy Management: An SoC design based on ARM926EJ-S; Arm Slideshow Presentation; 2003.
PCT Partial International Search Report and Written Opinion; PCT/GB2019/053135; dated Feb. 14, 2020.

* cited by examiner

100A

100B

RING OSCILLATOR BASED BITCELL DELAY MONITOR

CROSS-REFERENCE TO RELATED APPLICATION

This non-provisional patent application is related to the non-provisional patent application Ser. No. 16/183,660, filed 2018 Nov. 7, and titled, "SENSOR FOR PERFORMANCE VARIATION OF MEMORY READ AND WRITE CHARACTERISTICS", which is incorporated herein by reference in its entirety.

BACKGROUND

This section is intended to provide information relevant to understanding various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

Generally, low leakage memories are an important feature for some Internet-of-Things (IoT) and embedded applications. This need leads to Ultra-Low-Leakage (ULL) memory bitcells that are offered by foundries in various related technologies. To minimize leakage, some conventional bitcell transistors use high threshold voltage devices, which can cause significant limitations to speed performance. As such, for IoT and embedded designs, memory paths can limit speed performance and thus drive use of leakier high-speed transistors in logic to partly compensate for slow memories.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

DETAILED DESCRIPTION

Various implementations described herein refer to ring oscillator configurations that detect bitcell delay characteristics for adaptive scaling of voltage, memory internal margins and/or assist settings. For instance, various schemes and techniques described herein are related to configuring (or adapting) a bitcell array to form a ring oscillator that is capable of determining bitcell skews, including, e.g., SF and FS process skews, that are used for analyzing and evaluating bitcell performance and stability. Also, the ring oscillator configurations may be used in control loop schemes for memories in a system using adaptive voltage scaling. Further, frequency and a related frequency ratio between different types of ring oscillator configurations may be designed to provide information about global skew of bitcell transistors. This idea may also be used to determine a lowest safe supply voltage for executing read and write operations in the control loop for adaptive voltage scaling. To make use of adaptive voltage scaling (AVS) for memory, a delay monitor may be used to provide information on skew of the bitcell in addition to the skew of the logic. One way of collecting skew information is by measuring the frequency of a ring oscillator that is capable of detecting the skew between different types of switching devices within the memory bitcell. The ring oscillator may also operate as a delay chain without use of the ring connection. This subject matter and other various features of the ring oscillator will be described in greater detail herein below.

Various implementations of multi-input logic circuitry will now be described in greater detail herein with reference to FIGS. 1A-5D.

Figure 1A:
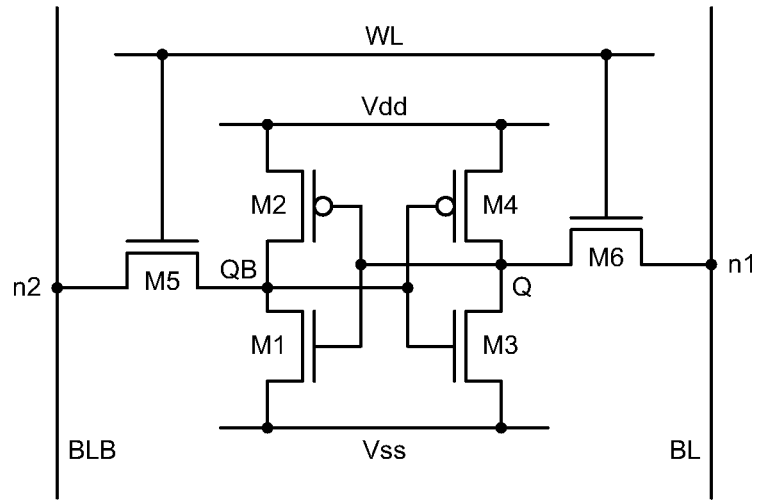
FIGS. 1A-1D illustrate diagrams of various bitcell circuitry in accordance with implementations described herein.
Figure 1B:
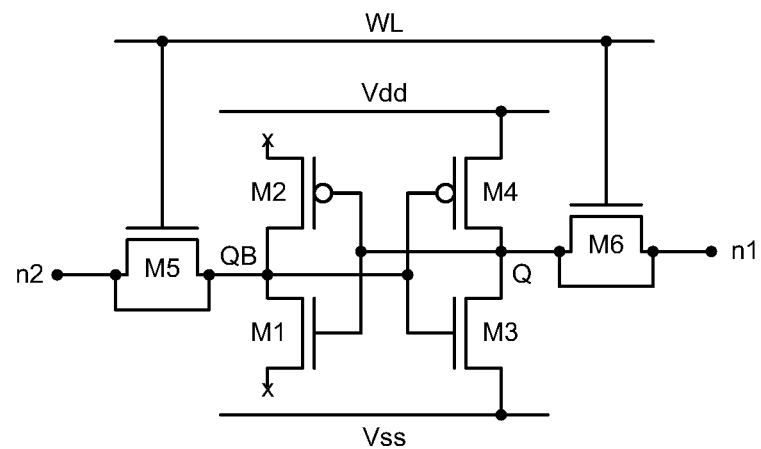
Figure 1C:
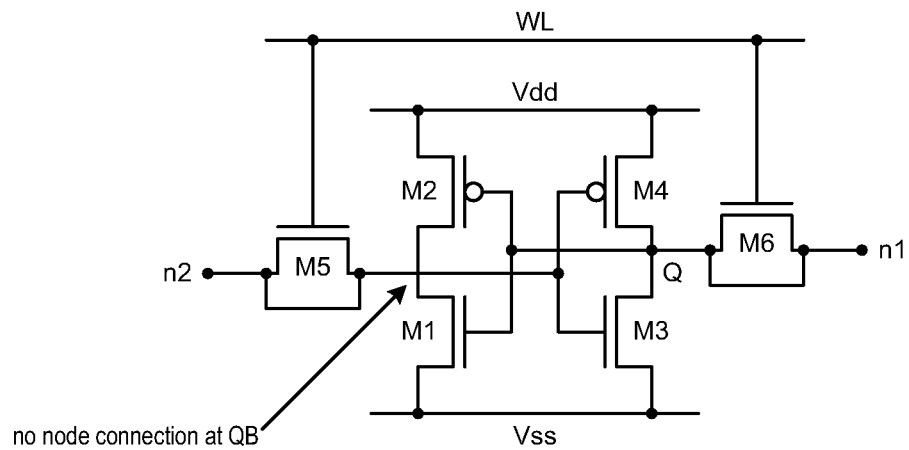
Figure 1D:
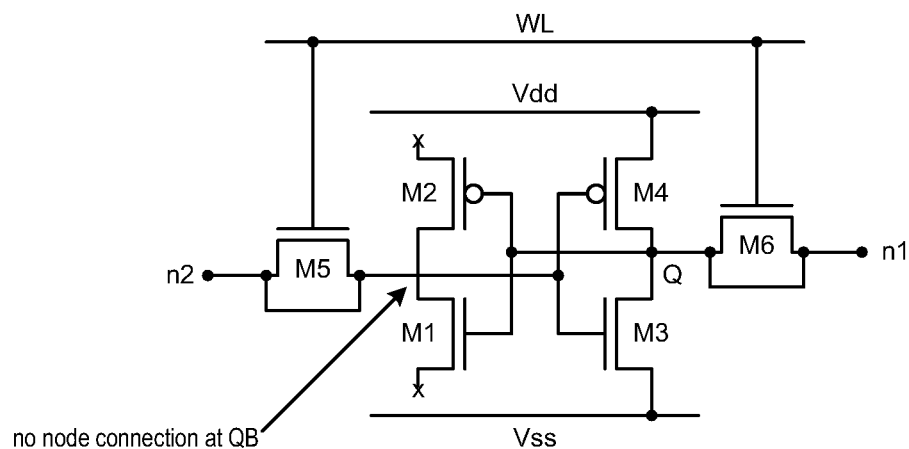

FIGS. 1A-1D illustrate diagrams of various bitcell circuitry in accordance with implementations described herein. In particular, FIG. 1A shows a diagram 100A of 6T bitcell circuitry 102, FIG. 1B shows a diagram 100B of 6T bitcell inverter circuitry 112, FIG. 1C shows a diagram 100C of 6T bitcell inverter circuitry 122, and FIG. 1D shows a diagram 100D of 6T bitcell inverter circuitry 132.

As shown in FIG. 1A, the 6T bitcell 102 may refer to a standard memory cell having some number (N) of transistors (T), such as, e.g., 6 transistors (6T). The 6T bitcell 102 may be configured to store at least one data bit value (e.g., related to storing logic 0 or 1). The 6T bitcell 102 may be referred to as a static random access memory (SRAM) cell, and thus, the 6T bitcell 102 may be implemented as a multi-transistor SRAM cell. In some instances, various other types of SRAM cells may be utilized, such as, e.g., 4T, 8T, 10T, or more transistors (T) per bit. In general SRAM bitcells may be characterized as having at least two inverters coupled or configured back to back in order to form a latch which will hold the data as long as power is applied to the power terminals. There may be any number of access devices, and the memory may support multiple single rail or dual rail bitlines. The unifying application of this design is how to turn the two inverters configured as a latch into a single inverter function. This concept will be explained through the discussion of application to the standard 6T (transistor) SRAM bitcell. However, it may be understood that it applies to any Static RAM bitcell. Also, as shown, the 6T bitcell 102 may include metal-oxide-semiconductor (MOS) transistors (M1, M2, M3, M4, M5, M6), which may include a combination of N-type MOS (NMOS) transistors and P-type MOS (PMOS) transistors. In this instance, the 6T bitcell 102 may include 4 NMOS transistors (M1, M3, M5, M6) and 2 PMOS transistors (M2, M4) that are arranged to provide a latching function with back-to-back inverters, such as, e.g., a first inverter (M3, M4) and a second inverter (M1, M2) that may be referred to as a feedback inverter. In this instance, the first inverter (M3, M4) may be coupled between voltage supply (Vdd) and ground (Vss, Gnd), and the second inverter (M1, M2) is also coupled between voltage supply (Vdd) and ground (Vss, Gnd). Also, gates of the transistors (M1, M2) are coupled to node Q, and gates of transistors (M3, M4) are coupled to node QB Further, as shown, transistors (M5, M6) are arranged to operate as passgate transistors. In this instance, transistor (M6) is coupled between node Q and a first bitline (BL) at node (n1), and transistor (M5) is coupled between node QB and a second bitline (BLB) at node (n2), wherein the second bitline (BLB) is a complement of the first bitline (BL). Also, gates of transistors (M5, M6) are coupled to wordline (WL), and transistors (M5, M6) are activated with a wordline signal from the wordline (WL).

As shown in FIG. 1B, the 6T bitcell inverter 112 may have a similar layout as the 6T bitcell 102 in FIG. 1A, except that the 6T bitcell inverter 112 may be arranged to have modified (or altered) node connections. For instance, the 6T bitcell inverter 112 may comprise a 6T bitcell that has been modified (or altered) to function as an inverter. In this instance, as shown, the second inverter (M1, M2) or feedback inverter may be decoupled from the voltage supply (Vdd) and ground (Vss, Gnd), e.g., with an open formed between transistor (M2) and the voltage supply (Vdd) and/or with another open formed between transistor (M1) and ground (Vss, Gnd). In this instance, as shown, this decoupling of the second inverter (M1, M2) or feedback inverter from the voltage supply (Vdd) and ground (Vss, Gnd) serves to disable the second inverter (M1, M2). In some instances, the term "disabled" may refer to nullifying operation (or function) of the second inverter (M1, M2), or rendering the second inverter (M1, M2) inoperable as an inverter. Also, in some instances, the passgate transistors (M5, M6) may be bypassed by shorting the source and drain. In some instances, the term "bypassed" may refer to disabling effective use of the passgate transistors (M5, M6) since the source and drain are shorted together, and thus, the gates of the passgate transistors (M5, M6) are rendered ineffective. Therefore, during operation of the 6T bitcell inverter 112, with the second inverter (M1, M2) disabled and the passgate transistors (M5, M6) bypassed, the first inverter (M3, M4) inverts a signal passing from node n2 and provides an inverted signal at node n1 via node Q.

As shown in FIG. 1C, the 6T bitcell inverter 122 may have a similar layout as the 6T bitcell 102 in FIG. 1A, except that the 6T bitcell inverter 122 may be arranged to have modified (or altered) node connections that is different than the 6T bitcell inverter in FIG. 1B. For instance, the 6T bitcell inverter 122 of FIG. 1C may comprise a 6T bitcell that has been modified (or altered) to function as an inverter, wherein the second inverter (M1, M2) or feedback inverter may be decoupled from node QB (no connection at node QB), wherein the coupling formed at node QB no longer exists. In this instance, as shown, transistor (M2) may be coupled to the voltage supply (Vdd), and transistor (M1) may be coupled to ground (Vss, Gnd). Further, in this instance, as shown, this decoupling of the second inverter (M1, M2) or feedback inverter from node QB serves to disable the second inverter (M1, M2). Also, in some instances, the passgate transistors (M5, M6) may be bypassed by shorting the source and drain. Therefore, during operation of the 6T bitcell inverter 122 of FIG. 1C, with the second inverter (M1, M2) disabled and with the passgate transistors (M5, M6) bypassed, the first inverter (M3, M4) inverts a signal passing from node n2 and provides an inverted signal at node n1 via node Q.

As shown in FIG. 1D, the 6T bitcell inverter 132 may have a similar layout as the 6T bitcell 102 in FIG. 1A, except that the 6T bitcell inverter 132 may be arranged to have a combination of the modified (or altered) node connections of FIGS. 1B-1C. For instance, the 6T bitcell inverter 132 may comprise a 6T bitcell that has been modified (or altered) to function as an inverter such that the second inverter (M1, M2) is decoupled from the voltage supply (Vdd) and ground (Vss, Gnd) and also is decoupled from node QB (no connection at node QB). In this instance, as shown, this decoupling of the second inverter (M1, M2) from the voltage supply (Vdd) and ground (Vss, Gnd) with no connection at node QB disables the second inverter (M1, M2). Also, in some instances, the passgates transistors (M5, M6) may be bypassed by shorting the source and drain. Therefore, during operation of the 6T bitcell inverter 132, with the second inverter (M1, M2) disabled and the passgate transistors (M5, M6) bypassed, the first inverter (M3, M4) inverts a signal passing from node n2 and provides an inverted signal at node n1 via node Q.

Figure 2A:
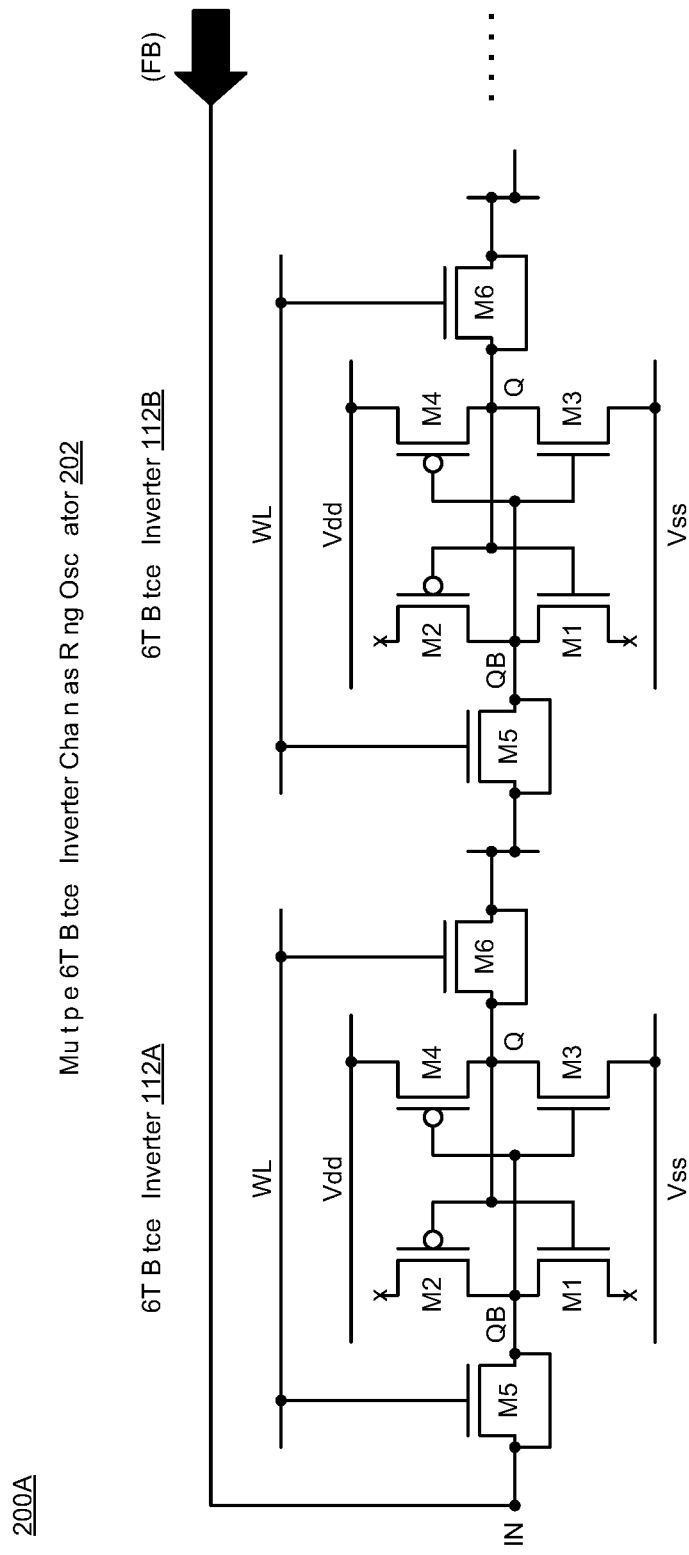
FIGS. 2A-2B illustrate diagrams of various bitcell chain circuitry in accordance with implementations described herein.
Figure 2B:
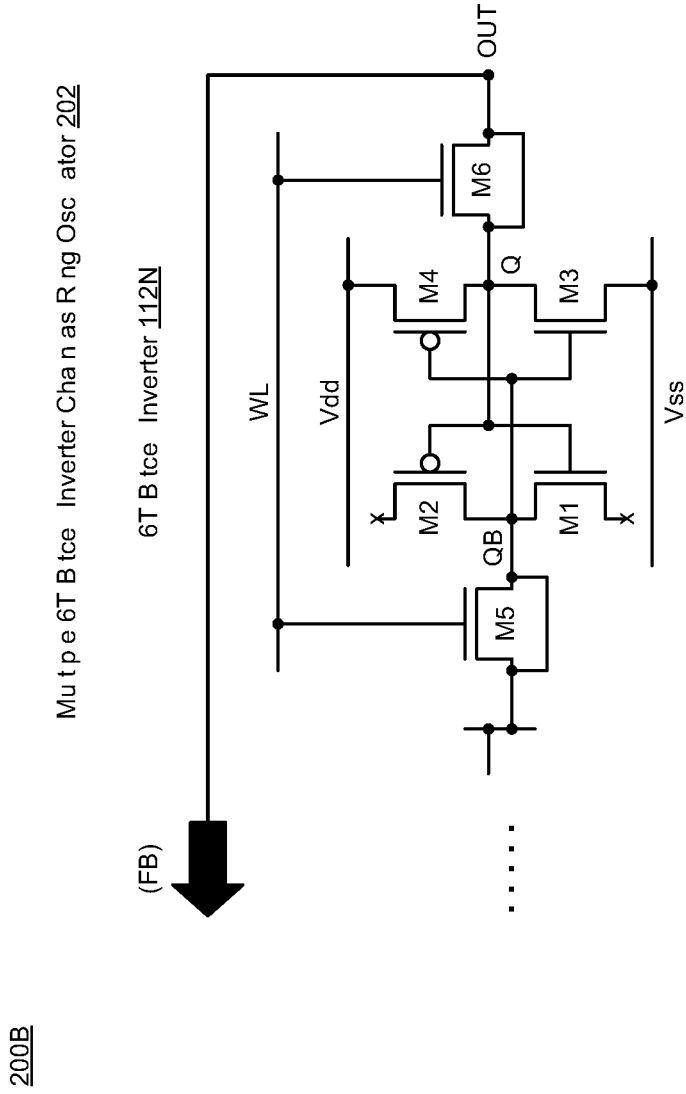

FIGS. 2A-2B illustrate diagrams of bitcell chain circuitry 202 in accordance with implementations described herein. In particular, FIG. 2A shows a diagram 200A of a first part of bitcell chain circuitry 202, and FIG. 2B shows another diagram 200B of a second part of the bitcell chain circuitry 202. In some implementations, the bitcell chain circuitry 202 may be referred to as a bitcell inverter chain.

As shown in FIGS. 2A-2B, the combination of the first and second parts of the bitcell inverter chain 202 provides for a multiple 6T bitcell inverter chain that is arranged to function as a ring oscillator. In some instances, the bitcell inverter chain 202 includes a row of bitcells (112A, 112B, ..., 112N) that are chained together in series to operate as a ring oscillator. Each bitcell in the row of bitcells (112A, 112B, ..., 112N) may have multiple transistors (M1, M2, ..., M6) that are independent of additional transistors to form the ring oscillator. The term "independent" may be defined as one or more or all transistors that are used to form the ring oscillator are bitcell transistors and their electrical characteristics are unchanged when compared to transistors in a bitcell for data storage purposes as shown in FIG. 1A. Also, the multiple transistors (M1, M2, ..., M6) of each bitcell in the row of bitcells (112A, 112B, ..., 112N) are arranged to function as an inverter, such as, e.g., one of the 6T bitcell inverters 112, 122, 132 in FIGS. 1B-1D. Further, each bitcell in the row of bitcells (112A, 112B, ..., 112N) may be implemented with a static random access memory (SRAM) bitcell, such as, e.g., a standard SRAM bitcell.

In some instances, each bitcell in the row of bitcells (112A, 112B, ..., 112N) may refer to a standard bitcell (or memory cell), and the multiple transistors (M1, M2, ..., M6) of each bitcell may be implemented with a predetermined number of transistors. As described herein above in reference to FIGS. 1B-1D, a first number of transistors (e.g., M3, M4) of the multiple transistors (M1, M2, ..., M6) of each bitcell may be arranged to function as the inverter, and a second number of transistors (e.g., M1, M2) of the multiple transistors (M1, M2, ..., M6) may be disabled, and further, a third number of the multiple transistors (e.g., M5, M6) may be bypassed. Also, the first number of transistors (M3, M4) and the second number of transistors (M1, M2) of the multiple transistors (M1, M2, ..., M6) of each bitcell may be arranged as back-to-back inverters with one of the inverters (e.g., M1, M2) being disabled so disable a latch function of each bitcell.

In some implementations, the effective electrical characteristics of the multiple transistors (M1, M2, ..., M6) of each bitcell remain unchanged, and the effective electrical characteristics keep drive strength of each transistor of the multiple transistors (M1, M2, ..., M6) unchanged. In some instances, the drive strength of each transistor may refer to its current carrying capability and threshold voltage. In some instances, front end layers of each transistor remain unchanged, thereby keeping drive strength unchanged. Also, in some instances, each front end layer is attempting to modify only connectivity of the transistors in the circuit while keeping the transistor strength or current carrying capability unchanged. Also, in some instances, a back end layer (e.g., a layer that is higher-up than contacts) may modify or attempt to modify only connectivity of the transistors in the circuit, while keeping the transistor strength unchanged or the current carrying capability unchanged. Since disabled or bypassed devices and/or wires may add capacitance, they may still contribute to the timing characteristics of the bitcell inverters (112A, 112B, . . . , 112N). Further, the ring oscillator configuration may be adapted from bitcells for data storage purposes to detect bitcell delay characteristics of the row of bitcells (112A, 112B, . . . , 112N) by modification of conductive connections within each bitcell in the row of bitcells (112A, 112B, . . . , 112N).

In various instances, the row of bitcells (112A, 112B, . . . , 112N) includes an odd number of bitcells to form the ring oscillator, e.g., with an output (OUT) of a last bitcell (112N) coupled to an input (IN) of a first bitcell (112A) so as to cause the row of bitcells (112A, 112B, . . . , 112N) to operate as the ring oscillator. In this instance, a signal provided from the output (OUT) of the last bitcell (112N) to the input (IN) of the first bitcell (112A) may be referred to as a feedback signal (FB). Also, in some instances, the row of bitcells (112A, 112B, . . . , 112N) may form part of an odd number of inverting stages to form the ring oscillator with an output of a last inverting stage coupled to an input of a first inverting stage so as to cause the row of bitcells to operate as the ring oscillator. An alternate implementation may cause one of the inverting stages, or inversions, to be an enable function that starts the ring oscillator function. This inversion stage functioning as an enable function may be in the same row as the other bitcells or it may be just outside the bitcell area and be in the periphery circuits in line with the bitcell row. This inversion stage may have the feedback signal FB from the last inverting bitcell structure be one of the inputs. Further, in some instances, each bitcell in the row bitcells (112A, 112B, . . . , 112N) that are arranged to operate as the inverter has an input coupled to a bitline (e.g., BL) and an output coupled to another bitline (e.g., BLB) that is a complement of the bitline (e.g., BL).

In some implementations, as described herein above in reference to FIG. 1B, the multiple transistors (M1, M2, . . . , M6) of each bitcell in the row of bitcells (112A, 112B, . . . , 112N) may include a first pair of transistors (M3, M4) and a second pair of transistors (M1, M2). In this instances, the second pair of transistors (M1, M2) may be disabled by being cut-off from a voltage supply (Vdd) and ground (Vss, Gnd) so as to be inoperable, and the first pair of transistors (M3, M4) may be adapted to operate as the inverter. In other implementations, as described herein above in reference to FIG. 1C, the multiple transistors (M1, M2, . . . , M6) of each bitcell in the row of bitcells (112A, 112B, . . . , 112N) may include a first pair of transistors (M3, M4) and a second pair of transistors (M1, M2), wherein the second pair of transistors (M1, M2) may be disabled by having an output node (QB) of the second pair of transistors (M1, M2) cut-off from gates of a first pair of transistors (M3, M4) so as to be inoperable, and the first pair of transistors (M3, M4) may be adapted to operate as the inverter.

Further, in some implementations, the multiple transistors (M1, M2, . . . , M6) of each bitcell in the row of bitcells (112A, 112B, . . . , 112N) include one or more passgate transistors (M5, M6) that are bypassed so as to be inoperable as passgates. Also, in this instance, the one or more passgate transistors (M5, M6) may be bypassed by shorting source and drawn terminals of the one or more passgate transistors (M5, M6). In some instances, as described in greater detail herein, the row of bitcells (112A, 112B, . . . , 112N) may include multiple rows of bitcells that are coupled in parallel.

Figure 3A:
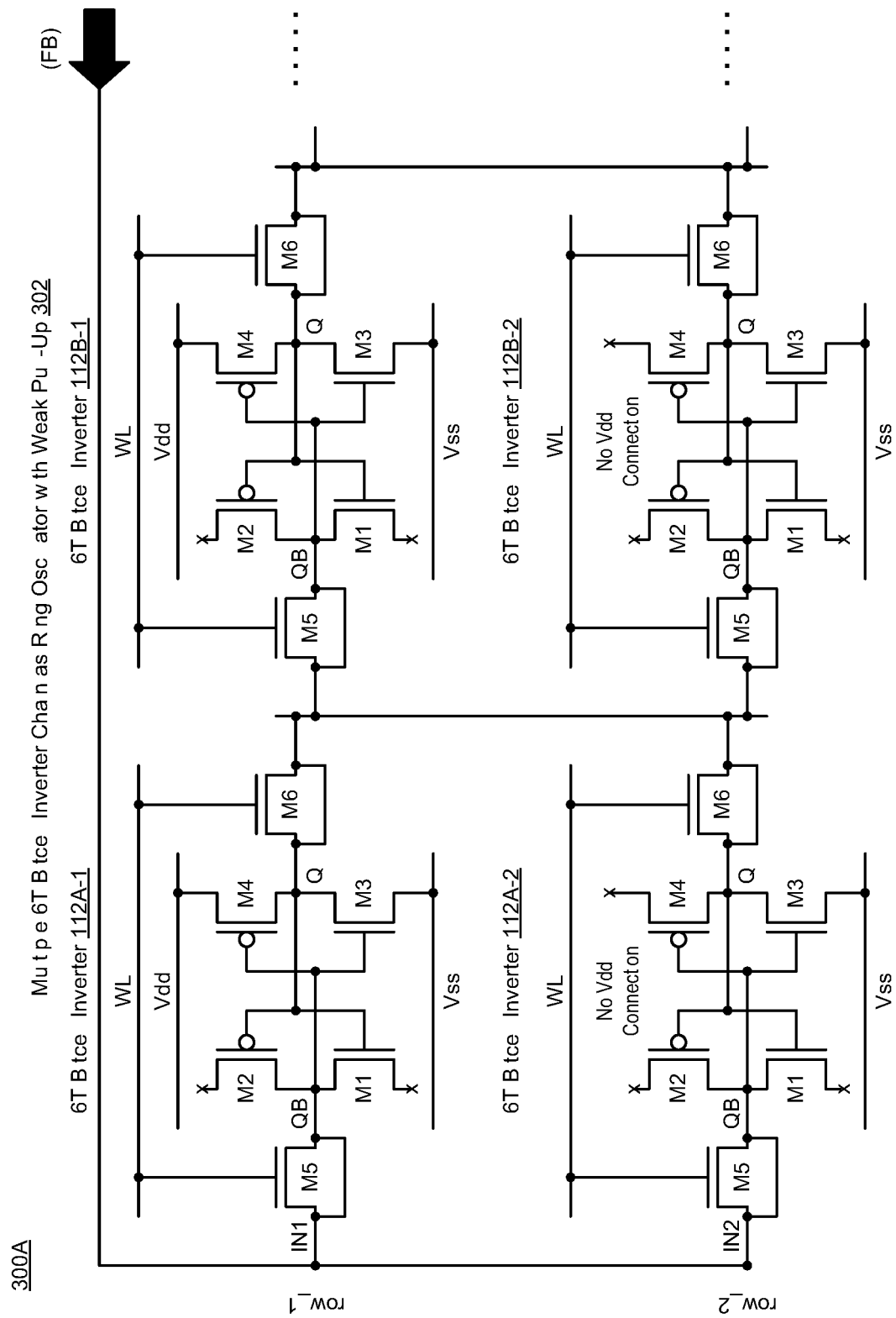
FIGS. 3A-3C illustrate diagrams of bitcell chain circuitry with weak pull-up in accordance with implementations described herein.
Figure 3B:
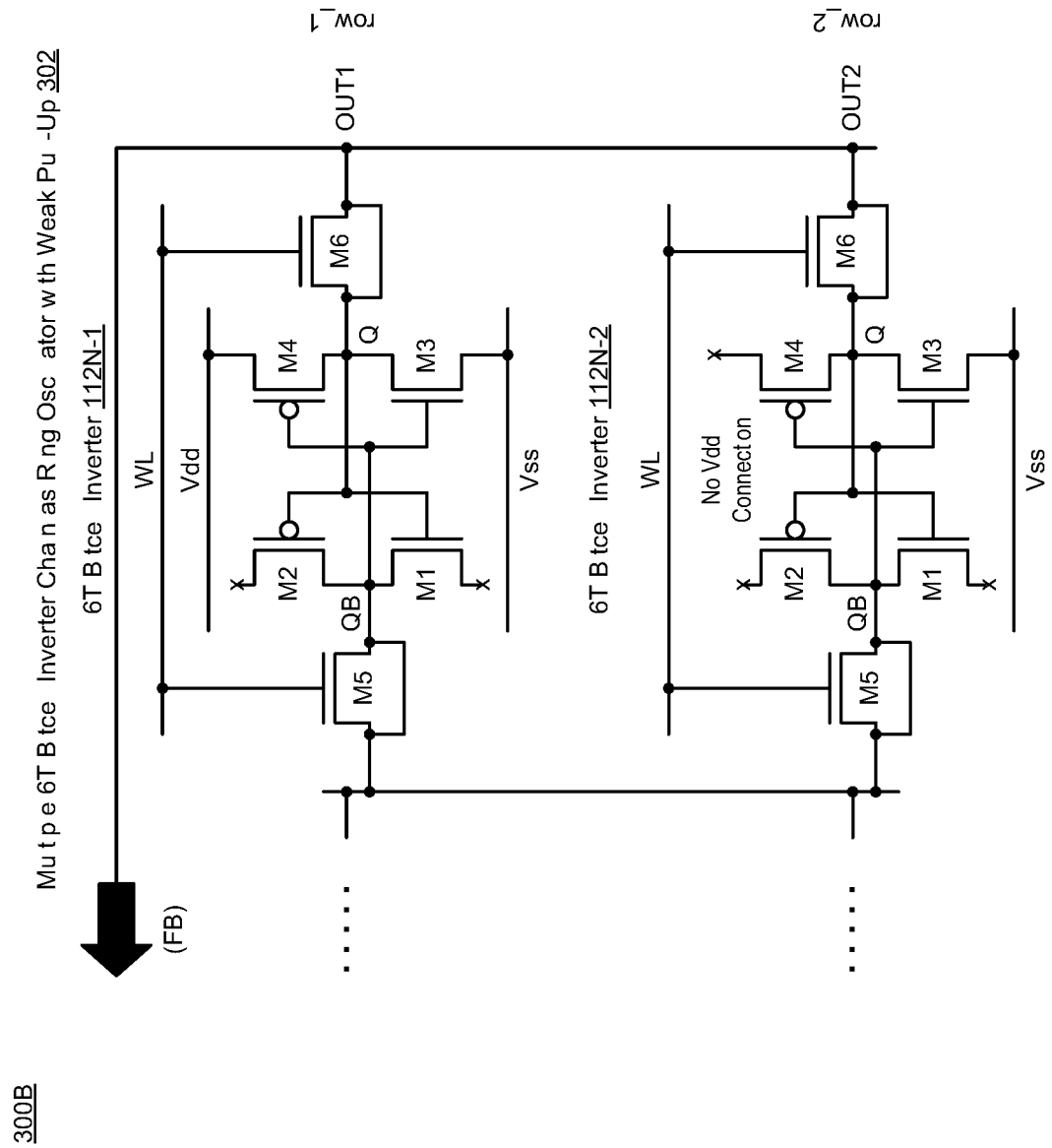
Figure 3C:
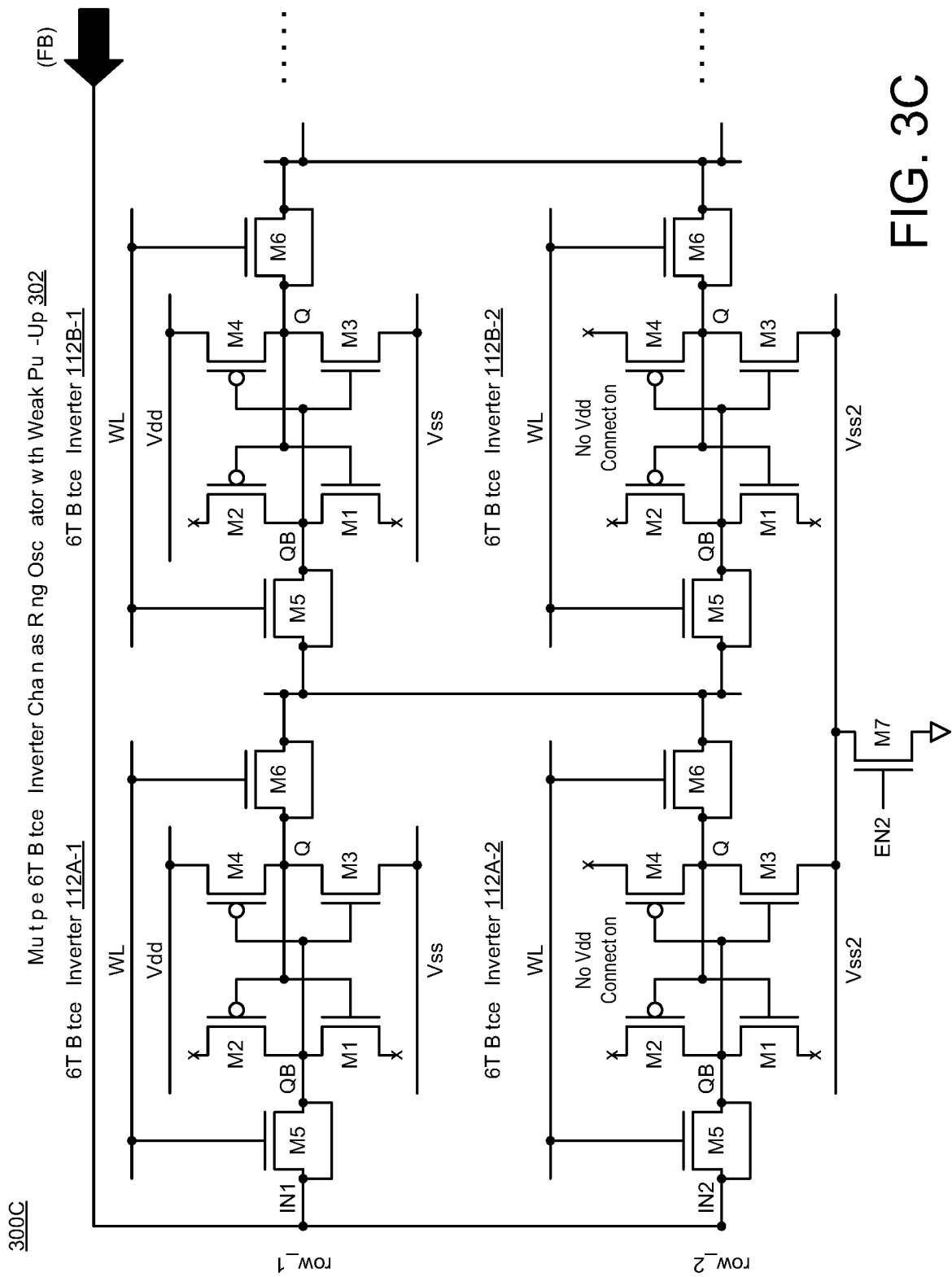

FIGS. 3A-3C illustrate diagrams of bitcell chain circuitry with weak pull-up 302 in accordance with implementations described herein. In particular, FIG. 3A shows a diagram 300A of a first part of bitcell chain circuitry 302 with weak pull-up configuration, and FIG. 3B shows another diagram 300B of a second part of the bitcell chain circuitry 302 with weak pull-up configuration. Also, FIG. 3C shows the bitcell chain circuitry 302 with use of a power switch (M7). The bitcell chain circuitry 302 may be referred to as a bitcell inverter chain having a weak pull-up circuit.

As shown in FIGS. 3A-3B, the combination of the first and second parts of the bitcell inverter chain 302 provides for a multiple 6T bitcell inverter chain disposed in a first row (row_1) that is arranged to operate as a ring oscillator with weak pull-up circuitry that is disposed in a second row (row_2). The first row of bitcells (112A-1, 112B-1, . . . , 112N-1) of row_1 may be arranged to operate as a ring oscillator, and the bitcells in the first row of bitcells (112A-1, 112B-1, . . . , 112N-1) of row_1 are arranged to function as inverters. Also, a second row of bitcells (112A-2, 112B-2, . . . , 112N-2) of row_2 may be coupled in parallel to the first row of bitcells (112A-1, 112B-1, . . . , 112N-1), and the second row of bitcells (112A-2, 112B-2, . . . , 112N-2) are arranged to provide a pull-down circuit for the bitcells in the first row of bitcells (112A-1, 112B-1, . . . , 112N-1). The pull-down circuit in row_2 is coupled in parallel to the inverter circuit in row_1 such that the combined circuitry of row_1 and row_2 function as a weak pull-up circuit. As such, each bitcell in the second row of bitcells (112A-2, 112B-2, . . . , 112N-2) are arranged to provide a pull-down circuit for each corresponding bitcell in the first row of bitcells (112A-1, 112B-1, . . . , 112N-1), wherein the net result of the combined circuitry provides a weak pull-up configuration.

In some implementations, the first row of bitcells (112A-1, 112B-1, . . . , 112N-1) in row_1 is similar in scope, function and operation as the multiple 6T bitcell inverter chain 202 that functions as a ring oscillator in FIGS. 2A-2B. As described herein above in FIGS. 2A-2B, the bitcells in the first row of bitcells (112A-1, 112B-1, . . . , 112N-1) include multiple transistors (M1, M2, . . . , M6), wherein the first number of transistors (M3, M4) of the multiple transistors (M1, M2, . . . , M6) are arranged to function as an inverter. Further, the second number of transistors (M1, M2, M4) of the multiple transistors (M1, M2, . . . , M6) are disabled, and in some instances, a third number of transistors (M5, M6) of the multiple transistors (M1, M2, . . . , M6) may be bypassed.

Also, in some implementations, the bitcells in the second row of bitcells (112A-2, 112B-2, . . . , 112N-2) include p-type transistors (PMOS) and n-type transistors (NMOS). In some instances, switching of the p-type transistors (PMOS: M2, M4) in the bitcells of the second row of bitcells (112A-2, 112B-2, . . . , 112N-2) may be disabled, e.g., as shown with no connection to the voltage supply (Vdd). In this instance, the PMOS transistors (M2, M4) may be decoupled from the voltage supply (Vdd), and the NMOS transistor (M1) may also be decoupled from ground (Vss, Gnd). Also, in this instance, NMOS transistor (M3) remains coupled to ground (Vss, Gnd) so as to provide a pull-down circuit when IN2 of row_2 is enabled (or activated). Also, the bitcells in the second row of bitcells (112A-2, 112B-2, ..., 112N-2) may include a power switch (e.g., NMOS M7 in FIG. 3C) that is enabled so as to selectively activate the pull-down circuit in row_2. For instance, as shown in FIG. 3C, at least one power switch transistor (M7) may be used to enable (or activate) the pull-down circuit in row_2 with another enable signal (EN2), wherein a local ground Vss2 may be coupled to ground (Vss, Gnd) through M7.

Further, in some implementations, the first row of bitcells (112A-1, 112B-1, ..., 112N-1) may include multiple first rows of bitcells, and the second row of bitcells (112A-2, 112B-2, ..., 112N-2) may include multiple second rows of bitcells that are coupled in parallel with the multiple first rows of bitcells. In this instance, a number of parallel pull-down circuits may be adjusted to achieve an effective increase of the effective pull-down strength of the first row of bitcells (112A-1, 112B-1, ..., 112N-1) by adding second pull-down transistors (M3) in the second row of bitcells (112A-2, 112B-2, ..., 112N-2) of similar strength to the bitcells in the first row of bitcells (112A-1, 112B-1, ..., 112N-1). In some instances, the effective increase of the effective pull-down strength may refer to an effective doubling (e.g., 2×) of the effective pull-down strength. In other instances, adding additional rows may further increase the pull-down strength.

Figure 4A:
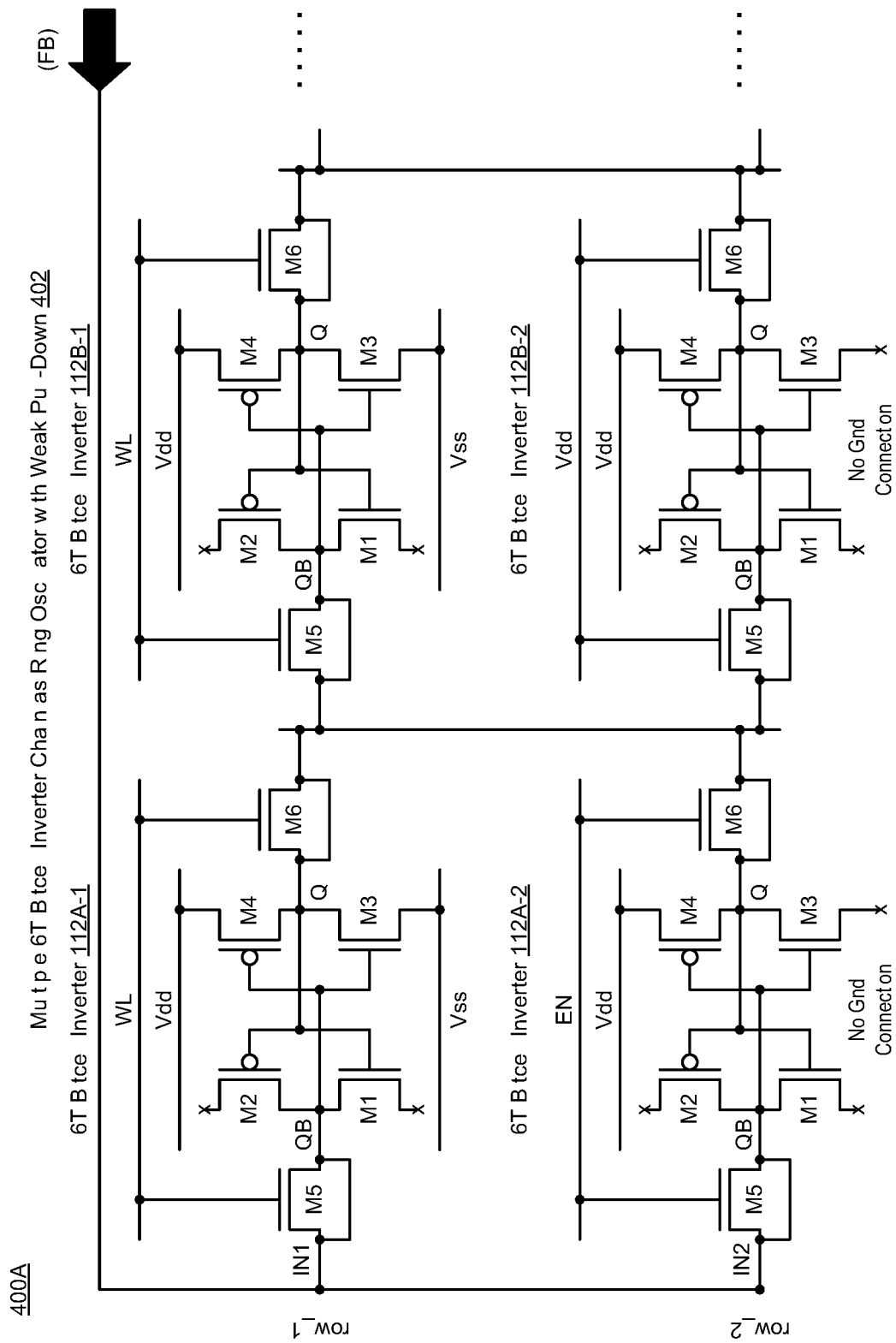
FIGS. 4A-4C illustrate diagrams of bitcell chain circuitry with weak pull-down in accordance with implementations described herein.
Figure 4B:
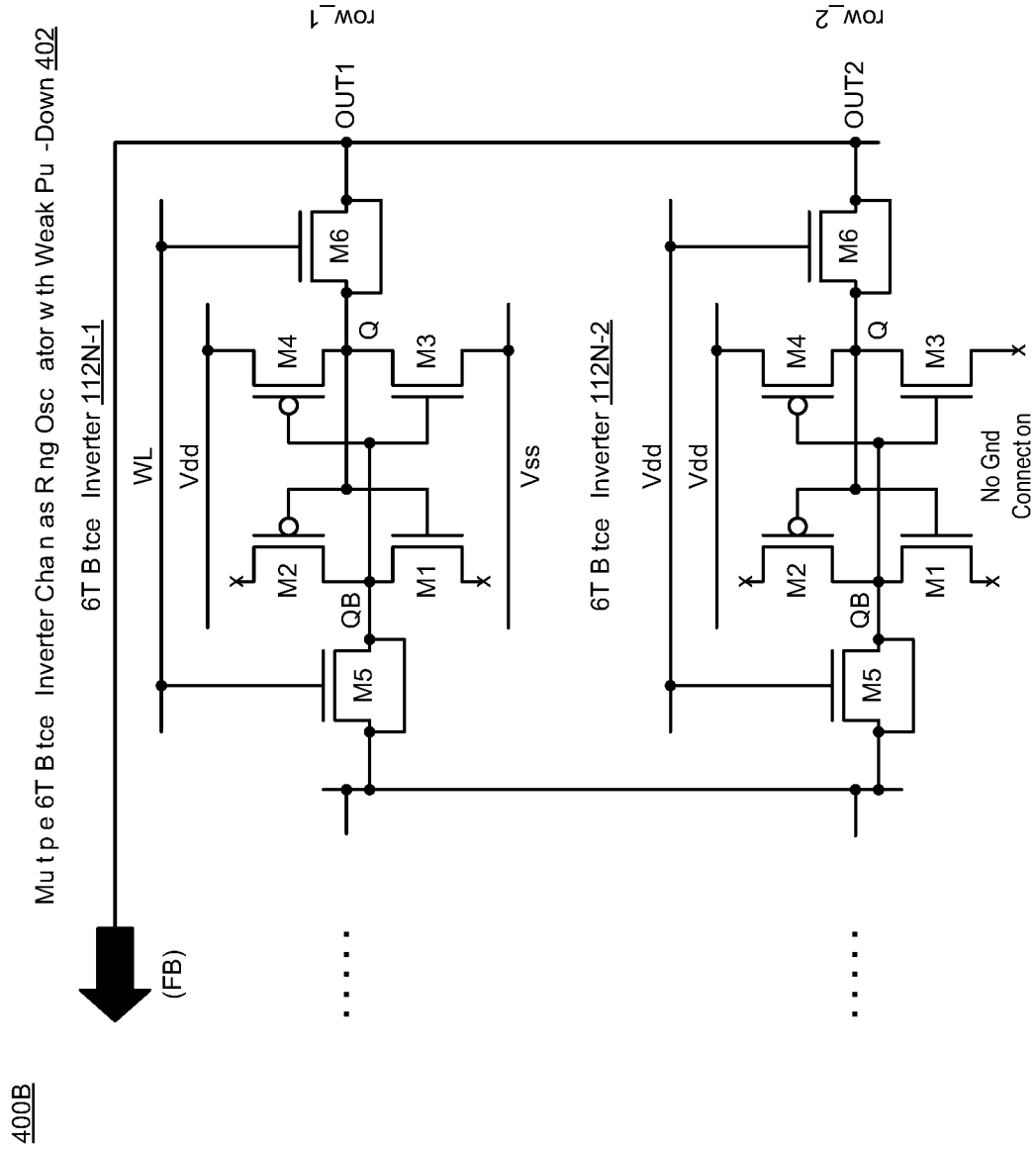
Figure 4C:
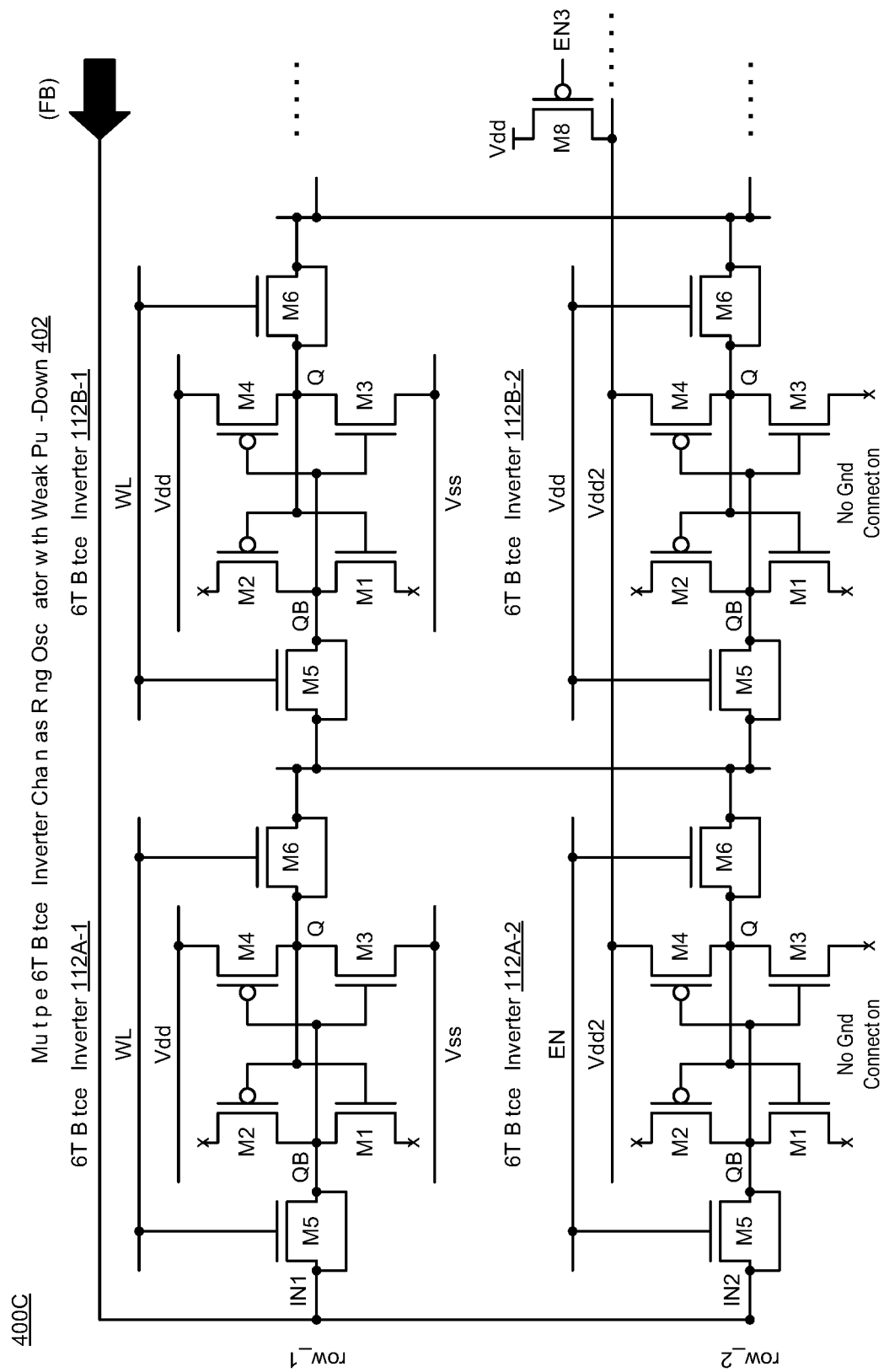

FIGS. 4A-4C illustrate diagrams of bitcell chain circuitry with weak pull-down 402 in accordance with implementations described herein. In particular, FIG. 4A shows a diagram 400A of a first part of bitcell chain circuitry 402 with weak pull-down configuration, and FIG. 4B shows another diagram 400B of a second part of the bitcell chain circuitry 402 with weak pull-down configuration. Also, FIG. 4C shows the bitcell chain circuitry 402 with use of a power switch (M8). The bitcell chain circuitry 402 may be referred to as a bitcell inverter chain having a weak pull-down circuit.

As shown in FIGS. 4A-4B, the combination of the first and second parts of the bitcell inverter chain 402 provides for a multiple 6T bitcell inverter chain disposed in a first row (row_1) that is arranged to operate as a ring oscillator with weak pull-down circuitry that is disposed in a second row (row_2). The first row of bitcells (112A-1, 112B-1, ..., 112N-1) of row_1 may be arranged to operate as a ring oscillator, and the bitcells in the first row of bitcells (112A-1, 112B-1, ..., 112N-1) of row_1 are arranged to function as inverters. Also, a second row of bitcells (112A-2, 112B-2, ..., 112N-2) of row_2 may be coupled in parallel to the first row of bitcells (112A-1, 112B-1, ..., 112N-1), and the second row of bitcells (112A-2, 112B-2, ..., 112N-2) are arranged to provide a pull-up circuit for the bitcells in the first row of bitcells (112A-1, 112B-1, ..., 112N-1). The pull-up circuit in row_2 is coupled in parallel to the inverter circuit in row_1 such that the combined circuitry of row_1 and row_2 function as a weak pull-down circuit. Thus, each bitcell in the second row of bitcells (112A-2, 112B-2, ..., 112N-2) are arranged to provide a pull-up circuit for each corresponding bitcell in the first row of bitcells (112A-1, 112B-1, ..., 112N-1), wherein the net result of the combined circuitry provides a weak pull-down configuration.

In some implementations, the first row of bitcells (112A-1, 112B-1, ..., 112N-1) in row_1 is similar in scope, function and operation as the multiple 6T bitcell inverter chain 202 that functions as a ring oscillator in FIGS. 2A-2B. As described herein above in FIGS. 2A-2B, the bitcells in the first row of bitcells (112A-1, 112B-1, ..., 112N-1) include multiple transistors (M1, M2, ..., M6), wherein the first number of transistors (M3, M4) of the multiple transistors (M1, M2, ..., M6) are arranged to function as an inverter. Further, the second number of transistors (M1, M2, M3) of the multiple transistors (M1, M2, ..., M6) are disabled, and in some instances, a third number of transistors (M5, M6) of the multiple transistors (M1, M2, ..., M6) may be bypassed.

Also, in some implementations, the bitcells in the second row of bitcells (112A-2, 112B-2, ..., 112N-2) include p-type transistors (PMOS) and n-type transistors (NMOS). In some instances, switching of the n-type transistors (NMOS: M1, M3) in the bitcells of the second row of bitcells (112A-2, 112B-2, ..., 112N-2) may be disabled, e.g., as shown with no connection to ground (Vss, Gnd). In this instance, the NMOS transistors (M1, M3) may be decoupled from ground (Vss, Gnd), and the PMOS transistor (M2) may also be decoupled from the voltage supply (Vdd). Also, in this instance, PMOS transistor (M4) remains coupled to the voltage supply (Vdd) so as to provide a pull-up circuit when IN2 of row_2 is enabled (or activated). Further, the bitcells in the second row of bitcells (112A-2, 112B-2, ..., 112N-2) may include a power switch (PMOS M8) that is enabled so as to selectively activate the pull-up circuit in row_2. For instance, the enable circuit may be similar to the enable circuit shown FIG. 3C, wherein as shown in FIG. 4C, at least one power switch transistor M8 may be used as a power switch to enable (or activate) the pull-up circuit in row_2 with another enable signal (EN3), wherein the local supply Vdd2 may be coupled to Vdd through M8.

Further, in some implementations, the first row of bitcells (112A-1, 112B-1, ..., 112N-1) may include multiple first rows of bitcells, and the second row of bitcells (112A-2, 112B-2, ..., 112N-2) may include multiple second rows of bitcells that are coupled in parallel with the multiple first rows of bitcells. In this instance, a number of parallel pull-up circuits may be adjusted to achieve an effective increase in the effective pull-up strength of the first row of bitcells (112A-1, 112B-1, ..., 112N-1) by adding second pull-up transistors (M4) in the second row of bitcells (112A-2, 112B-2, ..., 112N-2) of similar strength to the bitcells in the first row of bitcells (112A-1, 112B-1, ..., 112N-1). In some instances, the effective increase of the effective pull-up strength may refer to an effective doubling (e.g., 2×) of the effective pull-up strength.

Figure 5A:
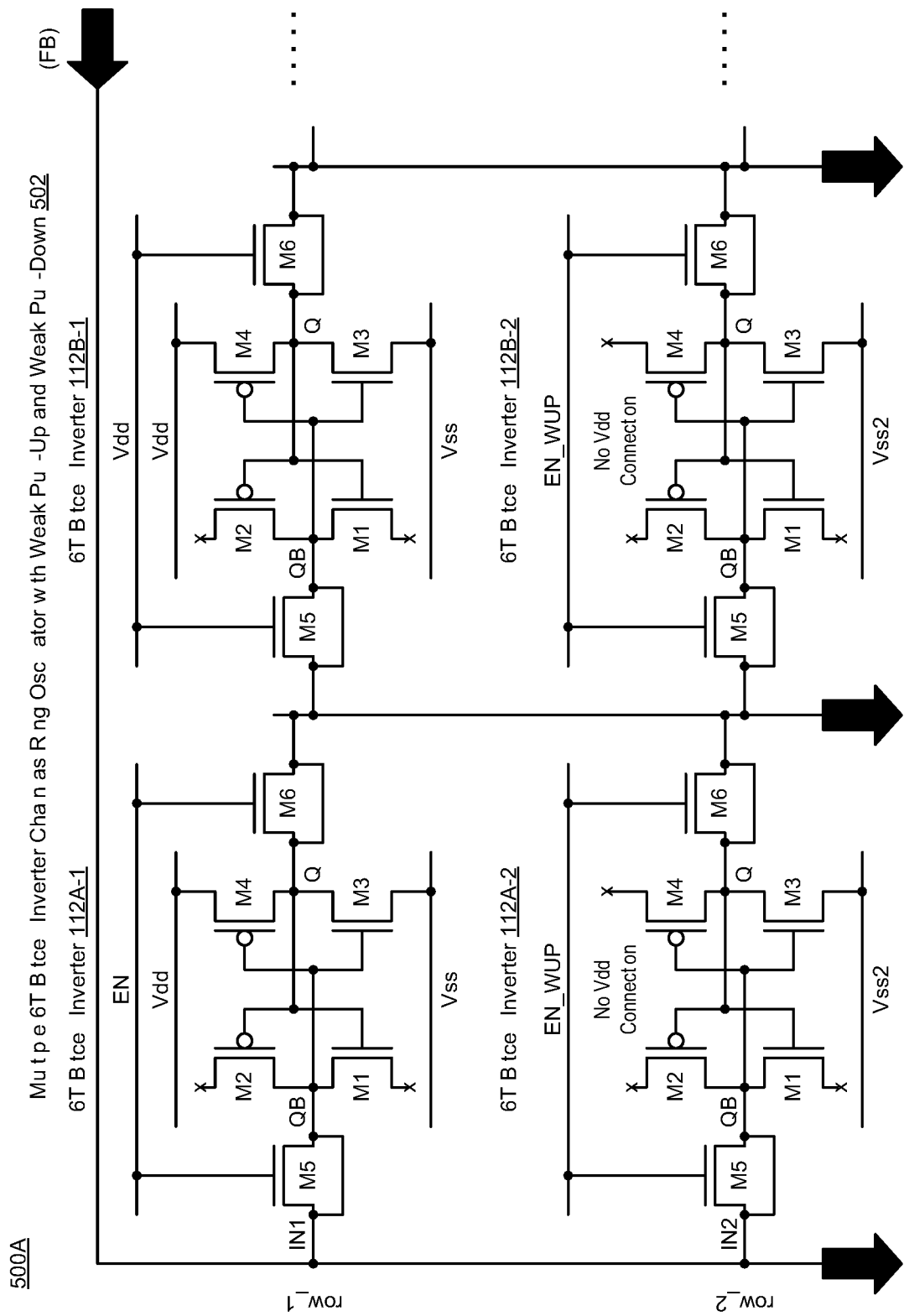
FIGS. 5A-5D illustrate diagrams of bitcell chain circuitry with weak pull-up and weak pull-down in accordance with implementations described herein.
Figure 5B:
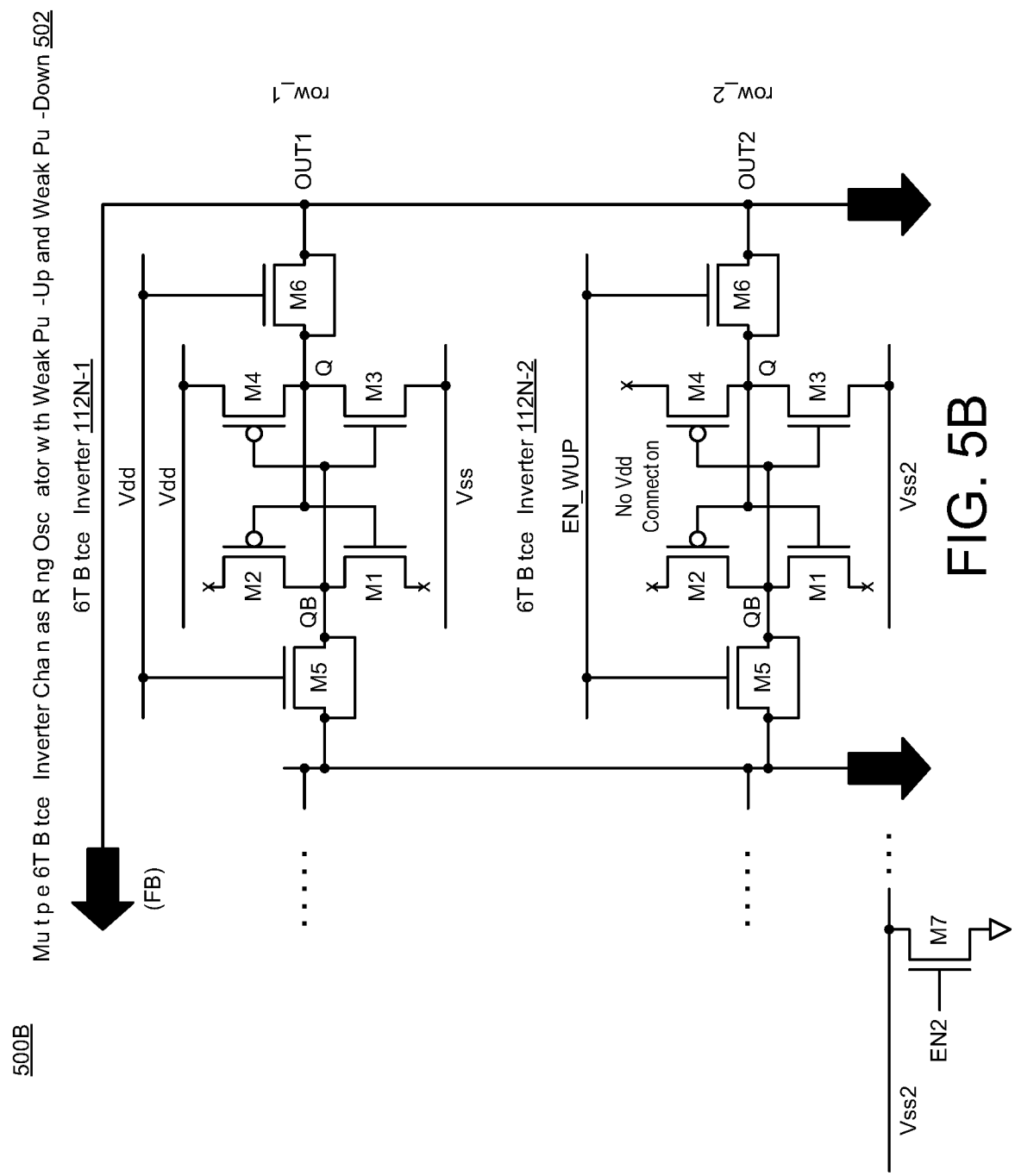
Figure 5C:
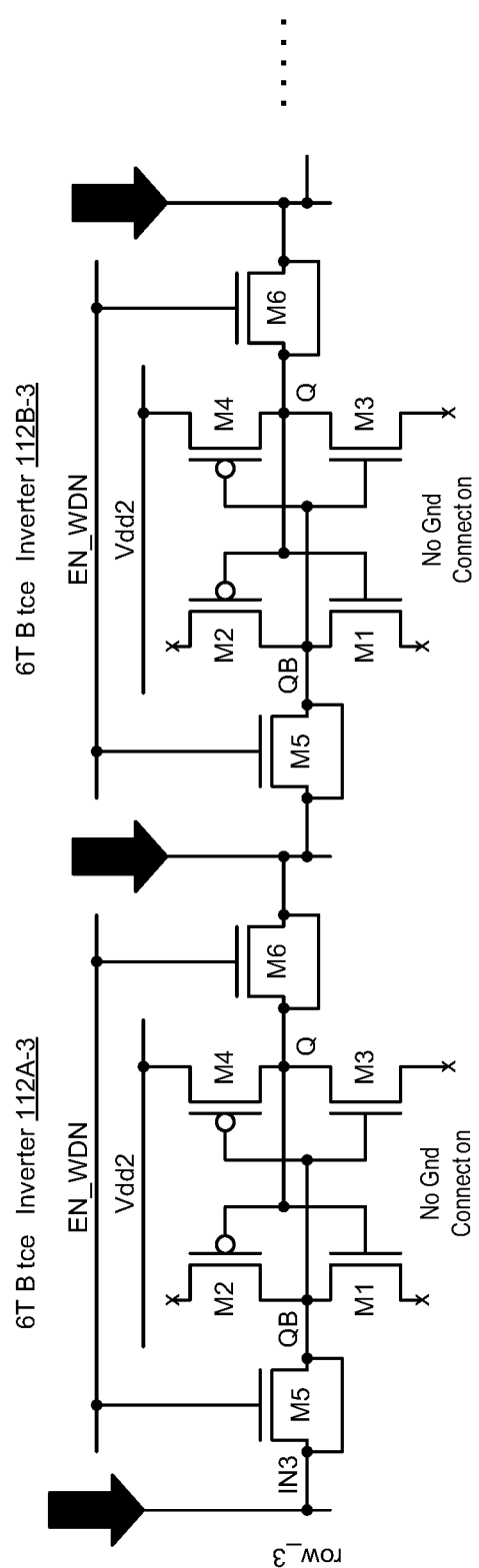
Figure 5D:
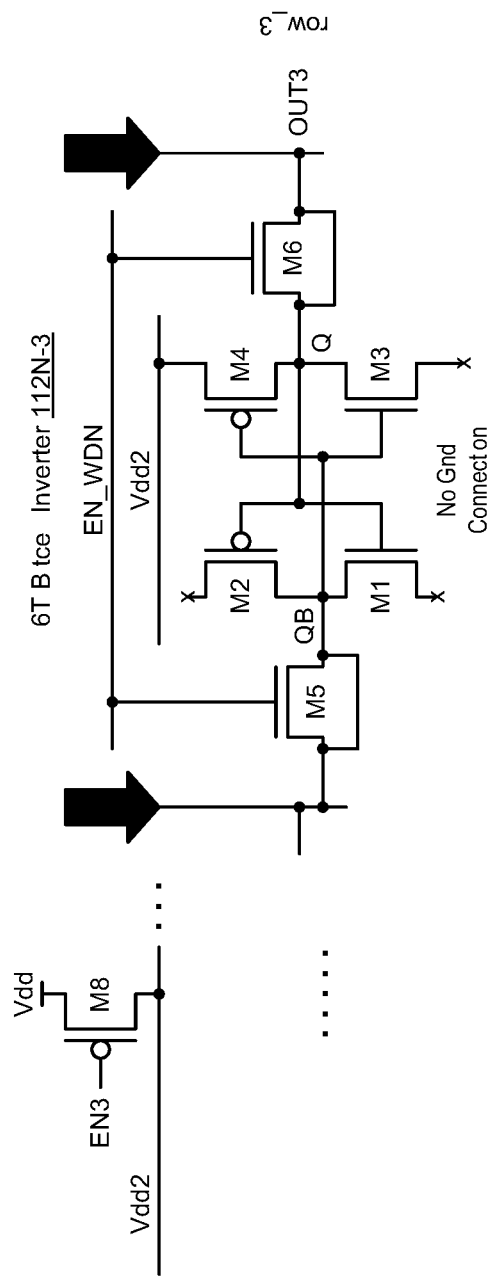

FIGS. 5A-5D illustrate diagrams of bitcell chain circuitry with weak pull-up and weak pull-down in accordance with some implementations described herein. In particular, FIG. 5A shows a diagram 500A of a first part of bitcell chain circuitry 502, FIG. 5B shows another diagram 500B of a second part of the bitcell chain circuitry 502, FIG. 5C shows another diagram 500C of a third part of the bitcell chain circuitry 502, and FIG. 5D shows another diagram 500D of a fourth part of the bitcell chain circuitry 502. In some implementations, the bitcell chain circuitry 502 may be configured to perform to as a bitcell inverter chain having a weak pull-up circuit and a weak pull-down circuit.

As shown in FIGS. 5A-5D, the combination of the first, second, third and fourth parts of the bitcell inverter chain 502 provides for a multiple 6T bitcell inverter chain disposed in a first row (row_1) that is arranged to operate as a ring oscillator with weak pull-up circuitry that is disposed in a second row (row_2) and with weak pull-down circuitry that is disposed in a third row (row_3). The first row of bitcells (112A-1, 112B-1, ..., 112N-1) of row_1 may be arranged to operate as a ring oscillator, and the bitcells in the first row of bitcells (112A-1, 112B-1, . . . , 112N-1) of row_1 are arranged to function as inverters. The second row of bitcells (112A-2, 112B-2, . . . , 112N-2) of row_2 may be coupled in parallel to the first row of bitcells (112A-1, 112B-1, . . . , 112N-1), and the second row of bitcells (112A-2, 112B-2, . . . , 112N-2) are arranged to selectively provide a pull-down circuit for the bitcells in the first row of bitcells (112A-1, 112B-1, . . . , 112N-1). The third row of bitcells (112A-3, 112B-3, . . . , 112N-3) of row_3 may be coupled in parallel to the first row of bitcells (112A-1, 112B-1, . . . , 112N-1) and the second row of bitcells (112A-2, 112B-2, . . . , 112N-2), and the third row of bitcells (112A-3, 112B-3, . . . , 112N-3) are arranged to selectively provide a pull-up circuit for the bitcells in the first row of bitcells (112A-1, 112B-1, . . . , 112N-1). In some implementations, as shown in FIG. 5B (similar to FIG. 3C), the pull-down circuits of row_2 may be selectively enabled with the enable signal (EN2) by activating the power-switch M7 (e.g., NMOS), and also as shown in FIG. 5D (similar to FIG. 4C), the pull-up circuits of row_3 may be selectively enabled with the enable signal (EN3) by activating the power-switch M8 (e.g., PMOS).

In some implementations, the pull-down circuit in row_2 is coupled in parallel with the inverter circuit in row_1 such that the combined circuitry of row_1 and row_2 function as a weak pull-up circuit. As such, each bitcell in the second row of bitcells (112A-2, 112B-2, . . . , 112N-2) are arranged to selectively provide a pull-down circuit for each corresponding bitcell in the first row of bitcells (112A-1, 112B-1, . . . , 112N-1), wherein the net result of the combined circuitry provides a weak pull-up oscillator configuration.

In addition, in some implementations, the pull-up circuit in row_3 is coupled in parallel with the inverter circuit in row_1 such that the combined circuitry of row_1 and row_3 function as a weak pull-down circuit. As such, each bitcell in the third row of bitcells (112A-3, 112B-3, . . . , 112N-3) are arranged to selectively provide a pull-up circuit for each corresponding bitcell in the first row of bitcells (112A-1, 112B-1, . . . , 112N-1), wherein the net result of the combined circuitry provides a weak pull-down oscillator configuration.

In some implementations, the first row of bitcells (112A-1, 112B-1, . . . , 112N-1) in row_1 is similar in scope, function and operation as the multiple 6T bitcell inverter chain 202 that functions as a ring oscillator in FIGS. 2A-2B. Also, the bitcells in the second row of bitcells (112A-2, 112B-2, . . . , 112N-2) include PMOS and NMOS, wherein switching of the PMOS transistors (M2, M4) in the bitcells of the second row of bitcells (112A-2, 112B-2, . . . , 112N-2) may be disabled, e.g., as shown with no connection to the voltage supply (Vdd). Further, the bitcells in the third row of bitcells (112A-3, 112B-3, . . . , 112N-3) include PMOS and NMOS, wherein switching of the NMOS transistors (M1, M3) in the bitcells of the third row of bitcells (112A-3, 112B-3, . . . , 112N-3) may be disabled, e.g., as shown with no connection to the ground (Vss, Gnd).

As described above, the bitcells in the second row of bitcells (112A-2, 112B-2, . . . , 112N-2) may include at least one pull-down transistor (M3) that is enabled so as to selectively activate the pull-down circuit in row_2. Also, as described above, the bitcells in the third row of bitcells (112A-3, 112B-3, . . . , 112N-3) may include at least one pull-up transistor (M4) that is enabled so as to selectively activate the pull-up circuit in row_3. In some instances, the first row of bitcells (112A-1, 112B-1, . . . , 112N-1) may include multiple first rows of bitcells, the second row of bitcells (112A-2, 112B-2, . . . , 112N-2) may include multiple second rows of bitcells that are coupled in parallel with the multiple first rows of bitcells, and the third row of bitcells (112A-3, 112B-3, . . . , 112N-3) may include multiple third rows of bitcells that are coupled in parallel with the multiple first rows of bitcells and the multiple second rows of bitcells. In this instance, parallel pull-down circuits in row_2 may be adjusted to achieve an effective increase in effective pull-down strength of the first row of bitcells (112A-1, 112B-1, . . . , 112N-1) by adding second pull-down transistors (M3) in the second row of bitcells (112A-2, 112B-2, . . . , 112N-2) of similar strength to the bitcells in the first row of bitcells (112A-1, 112B-1, . . . , 112N-1). In addition, parallel pull-up circuits in row_3 may be adjusted to achieve an effective increase in effective pull-up strength of the first row of bitcells (112A-1, 112B-1, . . . , 112N-1) by adding third pull-up transistors (M4) in the third row of bitcells (112A-3, 112B-3, . . . , 112N-3) of similar strength to the bitcells in the first row of bitcells (112A-1, 112B-1, . . . , 112N-1).

In some instances, power switches M7 (NMOS), external to the inverter chain, allow enabling a row with connections to M3 to activate pull-down circuits. Also, in some instances, power switches M8 (PMOS), external to the inverter chain, allow enabling a row with connections to M4 to activate pull-up circuits.

In reference to FIGS. 5A-5B, the bitcells in first row of bitcells (112A-1, 112B-1, . . . , 112N-1) in row_1 are arranged to behave (or function) as inverters, and thus, the chain of bitcells in the first row of bitcells (112A-1, 112B-1, . . . , 112N-1) in row_1 behave (or function) as a ring oscillator. In row_2, the source of each pull-up transistor (M2, M4) is decoupled from supply (Vdd), and this means that the bitcells in the second row of bitcells (112A-2, 112B-2, . . . , 112N-2) may only pull-down, and not pull-up. Hence, a ring modified (or altered) in this way has a weak pull-up and a strong pull-down, and thus, the ring frequency is more sensitive to the weaker pull-up PMOS transistor (M4). In row_3, the source of each pull-down transistor (M1, M3) is decoupled (or disconnected) from ground (Vss, Gnd), and this means that the bitcells in third row of bitcells (112A-3, 112B-3, . . . , 112N-3) may only pull-up, and not pull-down. Hence, a ring modified (or altered) in this way has a weak pull-down and a strong pull-up, and therefore, the ring frequency is more sensitive to the weaker pull-down NMOS transistor (M3).

In some implementations, FIGS. 5A-5D merge the ideas of FIGS. 3A-3B and 4A-4B into a single configuration. The first row (row_1) is arranged as a ring oscillator with Vdd and ground (Vss, Gnd) connections on all bitcells. The second row (row_2) is arranged with a pull-down configuration, i.e., as to provide an overall weak pull-up configuration, with no internal connections to Vdd. The third row (row_3) is arranged with a pull-up configuration, i.e., as to provide an overall weak pull-down configuration, with no internal connections to ground (Vss, Gnd). Also, in some instances, if source-to-drain shorts were removed, the pass-gate transistors (M5, M6) in row_1, row_2 and row_3 may be used to replace the power switches M7 and M8 to enable entire rows with corresponding gate enable signals (EN, EN_WUP, and EN_WDN). This circuit scheme provides for a compact layout to be tested as a bitcell ring oscillator along with a weak pull-up configuration and/or a weak pull-down configuration. Accordingly, in some instances, RAM monitors designed in this way may be integrated with ring oscillators for supervising logic devices in AVS. Moreover, one RAM monitor may provide information on the global skew of multiple RAM instances.

Figure 6:
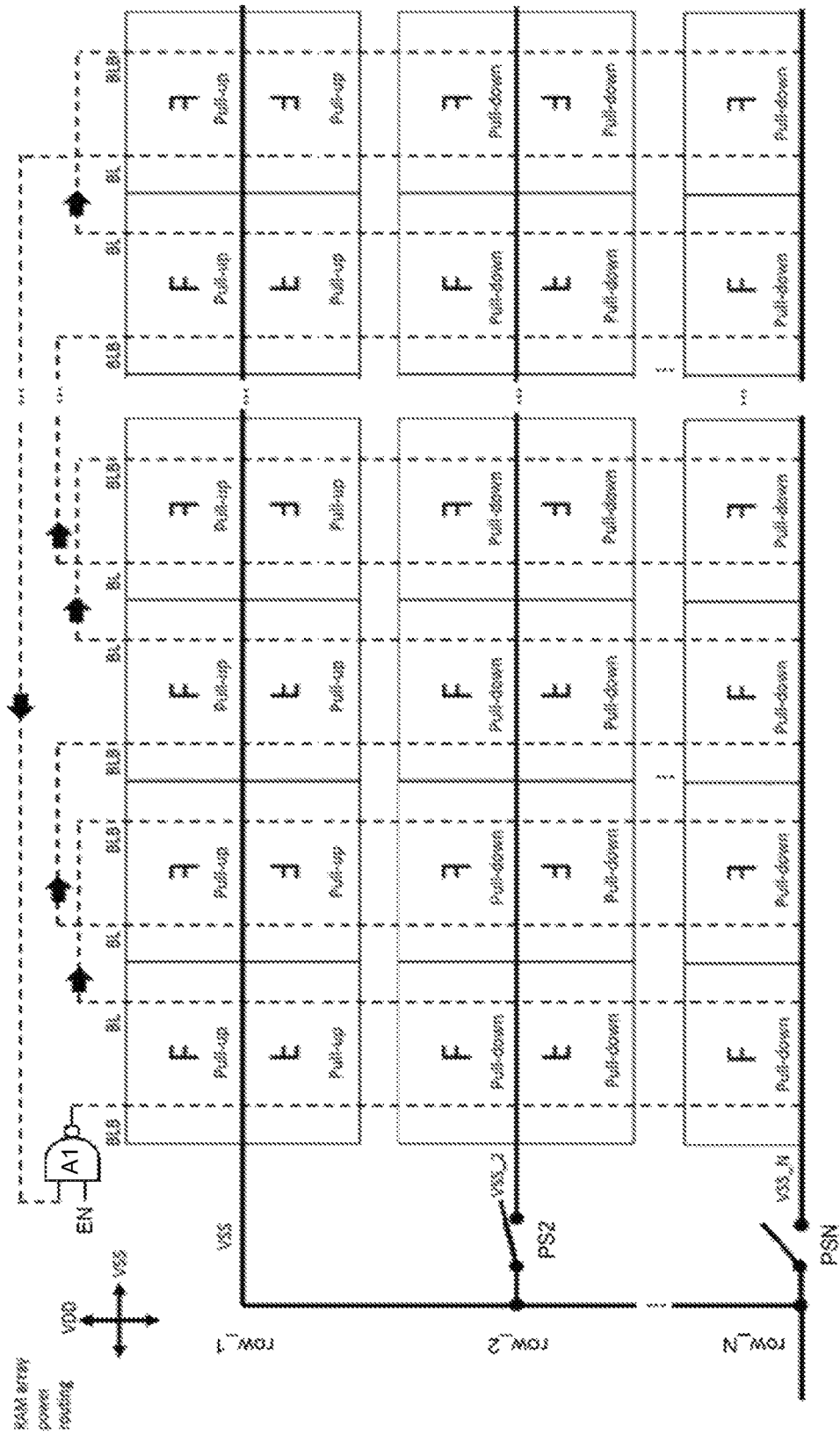
FIG. 6 illustrates a placed bitcell chain layout with configurable pull-up and pull-down behavior in accordance with implementations described herein.

In some implementations, the bitcells in first row of bitcells (112A-1, 112B-1, . . . , 112N-1) in row_1 may be omitted. In this case, at least one row with a pull-down configuration and one row with a pull-up configuration can replace the function of the inverter of row_1. FIG. 6 illustrates a placed bitcell chain layout 600 with configurable pull-up and pull-down behavior along with power switches 602 in accordance with implementations described herein. For instance, FIG. 6 shows a merged and configurable pull-up and pull-down arrangement along with power switches (PS2, PSN) in the rows to enable them.

FIG. 6 illustrates a fully placed bitcell oscillator according to FIGS. 5A-5D, wherein the first row of bitcells arranged to behave (or function) as inverters has been omitted. Columns within this arrangement form stages of the oscillator (or delay chain). Rows are configured as pull-down or pull-up, respectively. Cell placement is identical to the bitcell placement forming a memory array for storage purposes with mirroring of adjacent bitcells. Connections for Vdd and Vss are typically arranged to run within rows or columns or vice versa. To enable inverting stages for a ring or delay chain, at least one pull-down row must be connected to Vss. FIG. 6 shows a case where Vss runs in row direction and is shared between adjacent bitcells. In this case, the Vdd connections are shared within the array and Vss connections can be enabled for pairs of rows. The selection of enabled rows controls the overall balance of pull-down versus pull-up strength for the inverting stage formed in each column of the array. It should be understood that whatever supply is running in row direction can be used to select the relative strength, and thus, the sensitivity of the stage delay to the transistors provides pull-up or pull-down.

Further, in reference to FIG. 6, the placement of the array forming bitcell oscillator is identical to a bitcell array for data storage purposes, whereby one or more or all modifications provide for additional connections to bypass or provide for removal of connections to disable the function of certain transistors of the bitcell. These modifications may be made in process layers that do not affect the electrical characteristics of the transistors within the bitcell. The process layers that form the transistor devices and determine their electrical properties, typically referred to as front-end layers (FEOL), are identical between the modified bitcells described herein and the bitcells for data storage purposes. FEOL typically includes all CMOS process layers up to an including the contact level. The layers which may provide the connection modification of the bitcells outlined above may be interconnect levels above contact, typically metal and vias.

In some implementations, as shown in FIG. 6, a first row of bitcells (row_1) may be arranged to operate as a pull-up circuit, and a second row of bitcells (row_2) may be coupled in parallel to the first row of bitcells. In this instance, the second row of bitcells (row_2) may be arranged to provide a pull-down circuit for the bitcells in the first row of bitcells so as to form a ring oscillator. Also, a third row of bitcells (row_N) may be coupled in parallel to the second row of bitcells (row_2), and the third row of bitcells (row_N) may be arranged to operate as a ring oscillator. In this instance, the bitcells in the first row of bitcells (row_1) and the second row of bitcells (row_2) may be arranged to function as inverters, whereby row one may provide only the pull-up function of the inverter, and the row two may provide the pull-down function of the inverter. Also, the first row of bitcells (row_1) and the second row of bitcells (row_2) may include multiple rows of bitcells, and at least one of the power supply (VDD) and ground (VSS) may be coupled to the multiple rows of bitcells using one or more enable switches. Further, in some instances, a logic gate (e.g., a NAND gate (A1)) may be used to selectively enable the entire structure 602 or particular components of the structure 602, such as, e.g., one or more rows (e.g., row_1, row_2, . . . , row_N) of the structure 602.

Described herein are various implementations of an integrated circuit. The integrated circuit may include a row of bitcells that are chained together in series to operate as a ring oscillator. Each bitcell in the row of bitcells may have multiple transistors that are independent of additional transistors to form the ring oscillator. The multiple transistors of each bitcell in the row of bitcells are arranged to function as an inverter.

Described herein are various implementations of an integrated circuit. The integrated circuit may include a first row of bitcells arranged to operate as a ring oscillator, and the bitcells in the first row of bitcells may be arranged to function as inverters. The integrated circuit may include a second row of bitcells coupled in parallel to the first row of bitcells, and the second row of bitcells may be arranged to provide a pull-down circuit for the bitcells in the first row of bitcells.

Described herein are various implementations of an integrated circuit. The integrated circuit may include a first row of bitcells arranged to operate as a ring oscillator, and the bitcells in the first row of bitcells may be arranged to function as inverters. The integrated circuit may include a second row of bitcells coupled in parallel to the first row of bitcells, and the second row of bitcells may be arranged to provide a pull-up circuit for the bitcells in the first row of bitcells.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An integrated circuit, comprising:
   a row of bitcells that are chained together in series to operate as a ring oscillator,
   wherein each bitcell in the row of bitcells has multiple transistors that are arranged to function as an inverter, and
   wherein the multiple transistors of each bitcell include an input passgate transistor and an output passgate transistor that are bypassed by shorting source and drain terminals of the input and the output passgate transistors.

2. The integrated circuit of claim 1, wherein each bitcell in the row of bitcells refers to a standard bitcell, and wherein the multiple transistors of each bitcell are implemented with a predetermined number of transistors.

3. The integrated circuit of claim 1, wherein a first number of transistors of the multiple transistors of each bitcell are arranged to function as the inverter, and wherein a second number of transistors of the multiple transistors are disabled, and wherein a third number of the multiple transistors are bypassed.

4. The integrated circuit of claim 3, wherein the first number of transistors and the second number of transistors of the multiple transistors of each bitcell are arranged as back-to-back inverters with one inverter of the back-to-back inverters being disabled so as to disable a latch function of each bitcell.

5. The integrated circuit of claim 1, wherein effective electrical characteristics of the multiple transistors of each bitcell remain unchanged, and wherein the effective electrical characteristics keep strength of each transistor of the multiple transistors unchanged.

6. The integrated circuit of claim 1, wherein the ring oscillator is configured to detect bitcell delay characteristics of the row of bitcells by modification of conductive connections within each bitcell in the row of bitcells.

7. The integrated circuit of claim 1, wherein the row of bitcells form part of an odd number of inverting stages to form the ring oscillator with an output of a last inverting stage coupled to an input of a first inverting stage so as to cause the row of bitcells to operate as the ring oscillator.

8. The integrated circuit of claim 1, wherein each bitcell in the row bitcells that is arranged to operate as the inverter has an input coupled to a bitline and an output coupled to another bitline that is a complement of the bitline.

9. The integrated circuit of claim 1, wherein the multiple transistors of each bitcell in the row of bitcells include a first pair of transistors and a second pair of transistors, and wherein the first pair of transistors are disabled by having an output node of the first pair of transistors cut-off from gates of a second pair of transistors so as to be inoperable, and wherein the second pair of transistors are adapted to operate as the inverter.

10. The integrated circuit of claim 1, wherein:
    the input passgate transistor is bypassed so as to be inoperable as a passgate, and
    the output passgate transistor is bypassed so as to be inoperable as a passgate.

11. The integrated circuit of claim 1, wherein the row of bitcells includes multiple rows of bitcells that are coupled in parallel.

12. The integrated circuit of claim 1, wherein each bitcell in the row of bitcells is implemented with a static random access memory (SRAM) bitcell.

13. An integrated circuit, comprising:
    a row of bitcells that are chained together in series to operate as a ring oscillator,
    wherein each bitcell in the row of bitcells has multiple transistors that are arranged to function as an inverter,
    wherein the multiple transistors of each bitcell include an input passgate transistor that is bypassed by shorting source and drain terminals of the input passgate transistor;
    wherein the multiple transistors of each bitcell in the row of bitcells include a first pair of transistors and a second pair of transistors, and
    wherein the first pair of transistors are disabled by being cut-off from a voltage supply and ground so as to be inoperable, and wherein the second pair of transistors are adapted to operate as the inverter.

14. An integrated circuit, comprising:
    a row of bitcells that are chained together in series to operate as a ring oscillator,
    wherein each bitcell in the row of bitcells has multiple transistors that are arranged to function as an inverter,
    wherein the multiple transistors of each bitcell include an input passgate transistor that is bypassed by shorting source and drain terminals of the input passgate transistor;
    wherein the row of bitcells comprises a first row of bitcells, wherein the integrated circuit further comprises a second row of bitcells that is coupled in parallel to the first row of bitcells, and wherein each bitcell in the second row of bitcells is arranged to provide a pull-down circuit for each corresponding bitcell in the first row of bitcells.

15. The integrated circuit of claim 14, wherein the first row of bitcells includes multiple first rows of bitcells, and wherein the second row of bitcells includes multiple second rows of bitcells that are coupled in parallel with the first rows of bitcells, and wherein a number of parallel pull-down circuits is adjusted to achieve an effective increase of the effective pull-down strength of the first row of bitcells by adding second pull-down transistors in the second row of bitcells of similar strength to the bitcells in the first row of bitcells.

16. An integrated circuit, comprising:

a row of bitcells that are chained together in series to operate as a ring oscillator, wherein each bitcell in the row of bitcells has multiple transistors that are arranged to function as an inverter, wherein the multiple transistors of each bitcell include an input passgate transistor that is bypassed by shorting source and drain terminals of the input passgate transistor;

wherein the row of bitcells comprises a first row of bitcells, wherein the integrated circuit further comprises a second row of bitcells that is coupled in parallel to the first row of bitcells, and wherein each bitcell in the second row of bitcells is arranged to provide a pull-up circuit for each corresponding bitcell in the first row of bitcells.

17. The integrated circuit of claim 16, wherein the first row of bitcells includes multiple first rows of bitcells, and wherein the second row of bitcells includes multiple second rows of bitcells that are coupled in parallel with the first rows of bitcells, and wherein a number of parallel pull-up circuits is adjusted to achieve an effective increase of the effective pull-up strength of the first row of bitcells by adding second pull-up transistors in the second row of bitcells of similar strength to the bitcells in the first row of bitcells.

18. An integrated circuit, comprising:

a first row of bitcells arranged to operate as a ring oscillator, wherein the bitcells in the first row of bitcells are arranged to function as inverters, and wherein each bitcell in the first row of bitcells includes an input passgate and an output passgate that are bypassed by shorting source and drain terminals of the input and the output passgates; and a second row of bitcells coupled in parallel to the first row of bitcells, wherein the second row of bitcells are arranged to provide a pull-down circuit for the bitcells in the first row of bitcells.

19. The integrated circuit of claim 18, wherein the bitcells in the first row of bitcells include multiple transistors, and wherein a first number of transistors of the multiple transistors are arranged to function as an inverter, and wherein a second number of transistors of the multiple transistors are disabled, and wherein a third number of transistors of the multiple transistors are bypassed.

20. The integrated circuit of claim 18, wherein the bitcells in the second row of bitcells include p-type transistors and n-type transistors, and wherein switching of the p-type transistors in the bitcells of the second row of bitcells is disabled, and wherein the bitcells in the second row of bitcells include one or more pull-down transistors that are enabled so as to selectively activate the pull-down circuit.

21. An integrated circuit, comprising:

a first row of bitcells arranged to operate as a ring oscillator, wherein the bitcells in the first row of bitcells are arranged to function as inverters, wherein each bitcell in the first row of bitcells includes an input passgate and an output passgate that are bypassed by shorting source and drain terminals of the input and the output passgates; and a second row of bitcells coupled in parallel to the first row of bitcells, wherein the second row of bitcells are arranged to provide a pull-up circuit for the bitcells in the first row of bitcells.

22. The integrated circuit of claim 21, wherein the bitcells in the first row of bitcells include multiple transistors, and wherein a first number of transistors of the multiple transistors are arranged to function as an inverter, and wherein a second number of transistors of the multiple transistors are disabled, and wherein a third number of transistors of the multiple transistors are bypassed.

23. The integrated circuit of claim 21, wherein the bitcells in the second row of bitcells include p-type transistors and n-type transistors, and wherein switching of the n-type transistors in the bitcells of the second row of bitcells is disabled, and wherein the bitcells in the second row of bitcells include one or more pull-up transistors that are enabled so as to selectively activate the pull-up circuit.

24. An integrated circuit, comprising:

a first set of rows of bitcells arranged to operate as a pull-up circuit; and a second set of rows of bitcells coupled in parallel to the first set of rows of bitcells, wherein the second set of rows of bitcells is arranged to provide a pull-down circuit for bitcells in the first set of rows of bitcells so as to form a ring oscillator, and wherein the first set of rows of bitcells and the second set of rows of bitcells comprise of one or more rows of modified bitcells.

25. The integrated circuit of claim 24, further comprising a third set of rows of bitcells that is coupled in parallel to the first set of rows of bitcells and the second set of rows of bitcells and arranged to operate as a ring oscillator, wherein bitcells in the third set of rows of bitcells are arranged to function as inverters.

26. The integrated circuit of claim 24, wherein within the first set of rows of bitcells and the second set of rows of bitcells, at least one of a power supply (VDD) and ground (VSS) are coupled to all rows or a subset of rows using an enable switch.

* * * * *